United States Patent [19]

Vitek et al.

[11] Patent Number: 4,563,641

[45] Date of Patent: Jan. 7, 1986

[54] RADIATION UPSET THRESHOLD DETECTOR APPARATUS

[75] Inventors: Edmund J. Vitek, Glen Burnie; Robert O. Cherney, Ellicott City, both of Md.; Robert F. Snyder, Jr., Shrewsbury, Pa.

[73] Assignee: The United States of America as represented by the Secretary of the Air Force, Washington, D.C.

[21] Appl. No.: 550,286

[22] Filed: Nov. 9, 1983

[51] Int. Cl.[4] ................ G01R 31/02; G01R 19/16
[52] U.S. Cl. .................... 324/158 R; 307/358; 324/133; 340/661
[58] Field of Search ............ 307/358, 350, 360; 328/147, 146, 148; 324/133, 158 R; 340/661, 663; 356/229

[56] References Cited

U.S. PATENT DOCUMENTS

| | | | |
|---|---|---|---|
| 3,072,895 | 1/1963 | Kaufman | 340/661 |
| 3,733,498 | 5/1973 | Watson | 307/297 |
| 3,906,379 | 9/1975 | Tuhro | 328/112 |
| 4,104,545 | 8/1978 | Dallas et al. | 307/351 |
| 4,479,266 | 10/1984 | Eumurian et al. | 307/358 |

*Primary Examiner*—Ernest F. Karlsen
*Assistant Examiner*—Vinh Nguyen
*Attorney, Agent, or Firm*—Donald J. Singer; William Stepanishen

[57] ABSTRACT

Described herein is a radiation upset threshold detector apparatus for measuring the output from a circuit that is operating in a radiation environment to determine when the radiation upset threshold is exceeded for the circuit.

7 Claims, 1 Drawing Figure

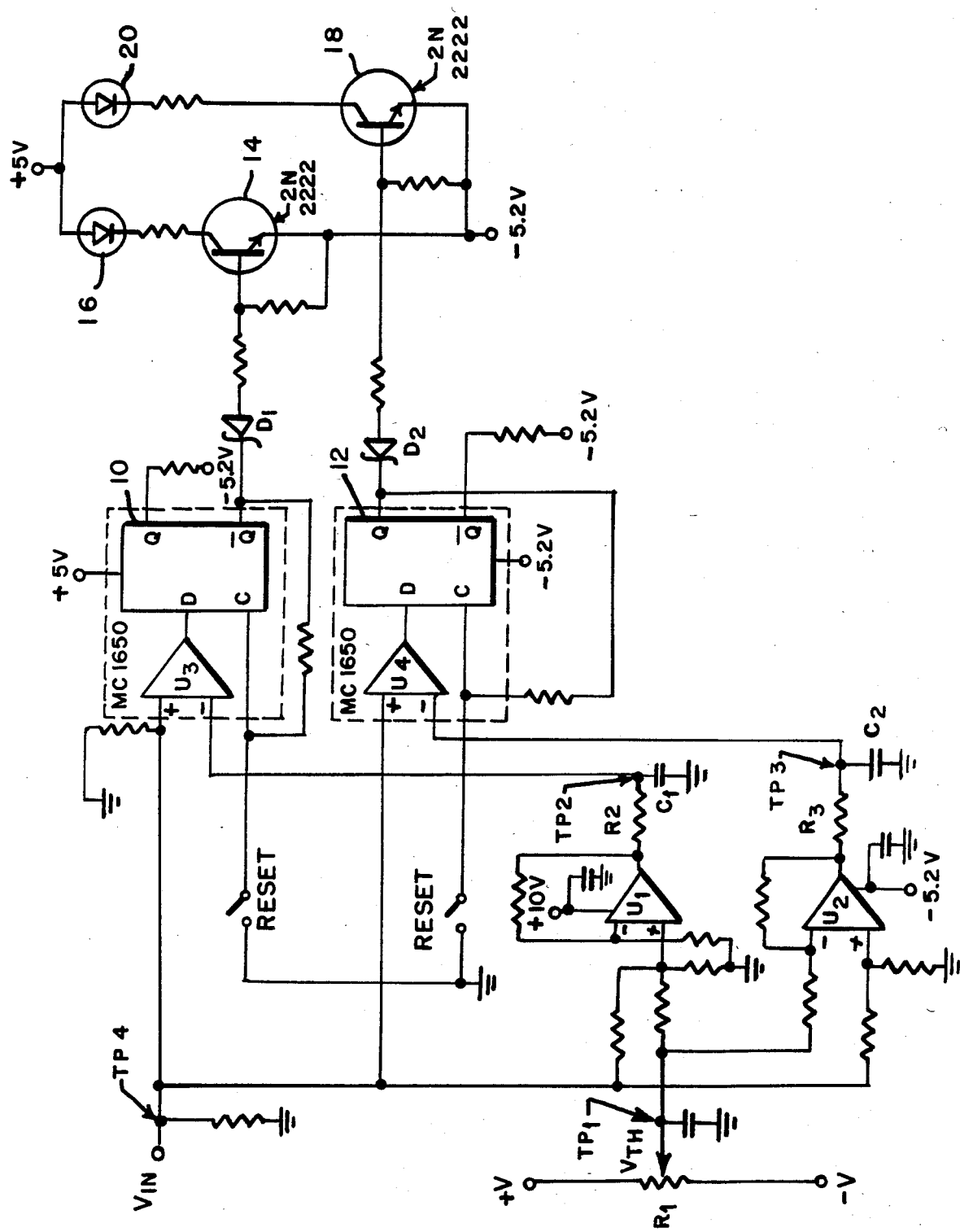

RADIATION UPSET THRESHOLD DETECTOR APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a threshold detector apparatus, and in particular to a radiation upset threshold detector apparatus.

When an electronic device utilizing semiconductors is operated in an environment which is subjected to radiation such as gamma rays, hole electron pairs are generated within the semiconductor material. These carriers move by diffusion and drift to and through the semiconductor junctions. The effect of these carriers passing through the semiconductor junction is to produce transient photocurrents. The current components which enter the base region are called the primary photocurrents. The major component of primary photocurrent is produced in the collector region and in the transition region of the collector-base junction. The emitter component of the primary photocurrent is, in general, substantially smaller than the major component of the primary photocurrent. The short diffusion length which is utilized in the emitter contributes to the smaller emitter component of the primary photocurrent.

In the prior art, the measurement of radiation-induced photocurrents in semi-conductor circuits was at best very difficult and subject to gross discrepancies. This is due to the fact that the instruments or devices which are utilized to make the photocurrent measurements are themselves subjected to and affected by the radiation conditions that produce the photocurrents in the semi-conductor devices. The present invention provides a method of photocurrent measurement which is simple and accurate.

SUMMARY OF THE INVENTION

The present invention utilizes an adder and subtractor circuit to convert the output signal from an electronic circuit that is operating in a radiation environment, to a pair of sum and difference voltages. These voltages are applied to a comparator unit to provide an indication when the radiation upset threshold level has been exceeded for the unit under test.

It is one object of the present invention therefore, to provide an improved radiation upset threshold detector apparatus.

It is another object of the invention to provide an improved radiation upset threshold detector apparatus which detects a voltage that exceeds a preset level by as little as 0.1 volt for more than 5 nanoseconds.

It is another object of the invention to provide an improved radiation upset threshold detector apparatus that is programmed to indicate circuit radiation upset.

It is yet another object of the invention to provide an improved radiation upset threshold detector apparatus wherein the radiation upset threshold level may be adjusted for the specific device under test.

These and other advantages, objects and features of the invention will become more apparent after considering the following description taken in conjunction with the illustrative embodiment in the accompanying drawing.

BRIEF DESCRIPTION OF THE DRAWING

The sole FIGURE is a schematic diagram of the radiation upset threshold detector apparatus in accordance with the present invention.

DESCRIPTION OF THE PREFERRED EMBODIMENT

Referring now to the FIGURE, there is shown a radiation upset threshold detector apparatus having an upset threshold level adjusting means which comprises potentiometer, $R_1$ and voltages, $+V$ and $-V$. The center arm of potentiometer, $R_1$ is connected to test point, TP1 at which the radiation upset threshold $V_{TH}$ appears. The circuit or unit under test (not shown) which is operated in a radiation environment, provides a voltage signal, $V_{in}$ to the radiation upset threshold detector apparatus at test point, TP4. The signals which appear at test point, TP1 and TP4 are simultaneously applied to a pair of operational amplifiers, U1 and U2. The radiation upset threshold level $V_{TH}$ is applied to the non-inverting input of U1 and the inverting input of U2. The unit under test (U.U.T) voltage signal is applied to the non-inverting inputs of both operational amplifiers U1 and U2. The operational amplifier U1 is arranged in an adder configuration with unity gain. The operational amplifier U2 is arranged in a subtractor configuration. These amplifiers U1, U2 are utilized to establish sum and difference voltages. Since the radiation upset level that is not tolerable varies with both the device and its application, the threshold detector must be adjusted to indicate the upset threshold established for the specific device. The threshold detector may be preset to indicate an upset at this level by means of an adjustable level control $R_1$. The level control $R_1$ is adjusted to the tolerance amount that the unit under test output can vary (either positively or negatively) before an upset is indicated. This tolerance which is shown as $V_{TH}$ is then added to and subtracted from the unit under test output and these sum and difference values are used as a means of comparison for changes in the unit under test output. These sum and difference values may be referred to as preset adjustable levels.

Once the upset threshold for a given unit under test is established, the threshold detector is adjusted by means of control $R_1$ to indicate an upset at this level by adjusting $V_{TH}$ such that the tolerance of the upset threshold voltage appears at TP1 and the upset thresholds appear at TP2 and TP3. The network comprising the resistor $R_2$ and capacitor $C_1$ which is connected to test point, TP2 and the resistor $R_3$ and capacitor $C_2$ which is connected to test point, TP3, are utilized to provide an RC storage circuit to maintain a relatively constant voltage at the test points TP2, TP3 during transients. The upset thresholds from test points TP2, TP3 are applied respectively to the inverting input of comparators U3 and U4. The voltage signal $V_{in}$ from point, TP4 is applied to the non-inverting input of both comparators U3 and U4. The comparators U3 and U4 compare the applied signals to determine radiation upset changes beyond the specified tolerance levels for the output of the unit under test. The output signal from the comparators U3 and U4 respectively represent a positive and a negative comparator signal which is representative of the radiation upset in the output signal from the unit under test. The positive comparator signal is applied to the "D"

input of the internal flip-flop (unit 10) of the A/D comparator which is configured as a latch. The negative comparator signal is applied to the "D" input of the internal flip-flop (unit 12) of the second A/D comparator which is also configured as a latch. A pair of reset switches are provided respectively to flip-flop units 10, 12 to allow a manual reset capability of the radiation upset threshold detector apparatus. The output of flip-flop unit 10 is taken at the Q terminal and is applied via driver unit 14 to the light emitting diode 16. The output of flip-flop unit 12 is taken at the Q terminal and is applied via driver unit 18 to the light emitting diode 20. In the present circuit arrangement, the diodes 18, 20 are in the "on" condition. Thus, when the unit under test provides an output signal which is above or below the comparison voltage, the respectively latching flip-flop 10 or 12 is triggered and either diode D1 or D2 is reverse biased to turn off the associated transistor driver. When this occurs, the LED lamp in the collector circuit goes out indicating that the radiation upset threshold for the unit under test has been exceeded. The light emitting diode (LED) lamp 16 is the high level lamp and LED lamp 20 is the low level lamp. In the present apparatus, operational amplifiers U1 and U2 are commercially available, and units with the designation LM 124 may be utilized in the present example. The latching flip-flops 10, 12 and comparators U3 and U4 are components of a dual A/D comparator integrated circuit that is available from Motorola, Inc. as part number MC 1650. The MC 1650 is an emitter coupled logic (ECL) type of digital integrated circuit. This device was utilized to obtain the speed required to detect an upset that may last only 20 nanoseconds. Propagation and switching times of this family of devices is typically less than 5.0 nanoseconds.

Although the invention has been described with reference to a particular embodiment, it will be understood to those skilled in the art that the invention is capable of a variety of alternative embodiments within the spirit and scope of the appended claims.

What is claimed is:

1. A radiation upset threshold detector apparatus comprising in combination:
   an input terminal to receive a voltage signal, said voltage signal containing radiation induced photo currents,
   means for setting a threshold level, said threshold level setting means being variable, said threshold level setting means providing an upset threshold voltage,
   means for adding and subtracting said voltage signal and said upset threshold voltage, said adding and subtracting means providing a sum and difference signal,
   means for comparing said voltage signal with said sum and difference signal, said comparing means compares said voltage signal with said sum and difference signal to provide a first and second compare signal, and
   latching flip-flop means connected to said comparing means to receive said first and second compare signal, said latching flip-flop means providing a first and second control signal, said latching flip-flop means providing either said first or said second control signal in response to the state of said first and second compare signal, said first control signal indicating a low to high radiation upset level, said second control signal indicating a high to low radiation upset level.

2. A radiation upset threshold detector apparatus as described in claim 1 further including an indicating means to provide a visual indication when the radiation upset threshold has been exceeded, said indicating means being connected to said latching flip-flop means, said indicating means responding to said first and second control signal.

3. A radiation upset threshold detector apparatus as described in claim 1 further including a reset means connected to said latching flip-flop means to reset said radiation upset threshold detector apparatus to the test ready state.

4. A radiation upset threshold detector apparatus as described in claim 1 wherein said threshold level setting meaning comprises a potentiometer connected between a positive and a negative voltage, said upset threshold voltage appearing on the center arm of said potentiometer.

5. A radiation upset threshold detector apparatus as described in claim 1 wherein said adding and subtracting means comprises a first and second operational amplifier, said first operational amplifier being arranged as an adder to provide said sum signal, said second operational amplifier being arranged as a subtractor to provide said difference signal.

6. A radiation upset threshold detector apparatus as described in claim 1 wherein said comparing means comprises a third and fourth operational amplifier, said third operational amplifier comparing said voltage signal with said sum signal, said fourth operational amplifier comparing said voltage signal with said difference signal.

7. A radiation upset threshold detector apparatus as described in claim 1 wherein said latching flip-flop means comprises a first and second A/D comparator means said first A/D comparator means providing said first control signal in response to the comparison of said voltage signal with said sum signal, and said second A/D comparator means providing said second control signal in response to the comparison of said voltage signal with said difference signal.

* * * * *